US006974762B2

(12) United States Patent
Gracias et al.

(10) Patent No.: US 6,974,762 B2
(45) Date of Patent: Dec. 13, 2005

(54) ADHESION OF CARBON DOPED OXIDES BY SILANIZATION

(75) Inventors: David H. Gracias, Portland, OR (US); Vijayakumar S. Ramachandrarao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/209,700

(22) Filed: Aug. 1, 2002

(65) Prior Publication Data

US 2004/0023515 A1 Feb. 5, 2004

(51) Int. Cl.[7] .......................... H01L 21/36; H01L 23/58
(52) U.S. Cl. ...................... 438/485; 438/690; 438/780; 438/781; 438/692; 438/786; 438/787; 438/782; 257/642; 257/789; 257/791; 257/40; 257/411; 257/410
(58) Field of Search ................................ 438/485, 690, 438/781, 778, 787, 99, 151, 158, 780, 623, 438/948, 782, 692, 628; 257/642, E21.279, 257/789, 791, 792, 40, 411, 410

(56) References Cited

U.S. PATENT DOCUMENTS

| | | | | |
|---|---|---|---|---|
| 4,778,727 | A | * | 10/1988 | Tesoro et al. ................ 428/448 |
| 4,950,583 | A | * | 8/1990 | Brewer et al. ............... 430/311 |
| 5,078,091 | A | * | 1/1992 | Stewart ........................ 118/719 |
| 5,527,621 | A | * | 6/1996 | Matsuura et al. ......... 428/473.5 |
| 5,760,480 | A | * | 6/1998 | You et al. .................... 257/783 |
| 6,103,624 | A | * | 8/2000 | Nogami et al. .............. 438/687 |
| 6,114,259 | A | * | 9/2000 | Sukharev et al. ........... 438/789 |
| 6,166,439 | A | * | 12/2000 | Cox ............................. 257/758 |
| 6,383,466 | B1 | * | 5/2002 | Domansky et al. .......... 423/335 |
| 6,455,443 | B1 | * | 9/2002 | Eckert et al. ................ 438/781 |
| 6,503,840 | B2 | * | 1/2003 | Catabay et al. .............. 438/694 |
| 6,506,675 | B1 | * | 1/2003 | Oomiya et al. .............. 438/677 |
| 6,566,283 | B1 | * | 5/2003 | Pangrle et al. ............... 438/788 |
| 6,716,771 | B2 | * | 4/2004 | Buehler et al. .............. 438/783 |
| 6,762,127 | B2 | * | 7/2004 | Boiteux et al. .............. 438/702 |
| 6,800,940 | B2 | * | 10/2004 | Catabay et al. .............. 257/759 |
| 2002/0192660 | A1 | * | 12/2002 | Okamura et al. ........... 430/320 |
| 2003/0068480 | A1 | * | 4/2003 | Andry et al. ................ 428/210 |
| 2003/0134495 | A1 | * | 7/2003 | Gates et al. ................. 438/600 |
| 2004/0018748 | A1 | * | 1/2004 | Lu et al. ..................... 438/778 |

OTHER PUBLICATIONS

"Tailoring Surfaces with Silanes" Chemtech, Dec. 1977 ppgs. 766-778.
Lutz, M.A. et al., "Novel Silane Adhesion Promoters for Hydrosilylation Cure Systems", Silanes and Other Coupling Agents, vol. 2.
Plueddemann, Edwin P., "Chemistry of Silane Coupling Agents" Silane Coupling Agents 1982 Plenum Press New York.
Knapp, H.F. et al. "Preparation, Comparison and Performance of Hydrophobic AFM Tips" Surf. Interface Anal. 27 324-331 (1999).

* cited by examiner

Primary Examiner—B. William Baumeister
Assistant Examiner—Igwe U. Anya
(74) Attorney, Agent, or Firm—Blakely, Sokoloff, Taylor & Zafman LLP

(57) ABSTRACT

A method of silanizing the surface of a low-k interlayer dielectric oxides (carbon doped oxides or organo-silicate glasses) to improve surface adhesion to adjacent thin film layers in damascene integration of microelectronic devices. A low-k interlayer dielectric oxide may be exposed to the vapor of a silane-coupling agent in order to modify its surface energy to improve adhesion with adjacent thin film layers. A low-k interlayer dielectric oxide can also be silanized by dipping the low-k interlayer dielectric oxide in a solution of silane-coupling agent. The silane-coupling agent will cause covalent bonds between the low-k interlayer dielectric oxide and the adjacent thin film thereby improving adhesion.

23 Claims, 16 Drawing Sheets

US 6,974,762 B2

ADHESION OF CARBON DOPED OXIDES BY SILANIZATION

FIELD OF THE INVENTION

Embodiments of the invention relate to silanization. In particular, embodiments of the invention relate to silanization of carbon doped oxides in the manufacture of microelectronic devices.

BACKGROUND OF THE RELATED ART

Low-k interlayer dielectric materials are used as insulating layers between copper interconnect lines in microelectronic devices. A class of these low-k interlayer dielectric materials are called carbon doped oxides or organo-silicate glasses. These low-k interlayer dielectric materials typically have poor adhesion to a variety of thin films including but not limited to SiN and SiC, which are often used as hard mask, etch stops, and barrier seed layers. Low adhesion between low-k interlayer dielectric materials and other thin films used in semiconductor manufacturing make the low-k interlayer dielectric materials difficult to integrate into a semiconductor device. Poor adhesion may contribute to delamination during chemical mechanical polishing, repeated thermal cycling, or packaging. This delamination can result in decreased performance or even catastrophic failure of the device.

BRIEF DESCRIPTION OF THE DRAWINGS

Embodiments of the invention may be best understood by referring to the following description and accompanying drawings that are used to illustrate the embodiments of the invention. In the drawings.

DETAILED DESCRIPTION

In the following description, numerous specific details are set forth. However, it is understood that embodiments of the invention may be practiced without these specific details. In other instances, well-known details, such as particular materials or methods, have not been shown in detail in order not to obscure the understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Figure 1:
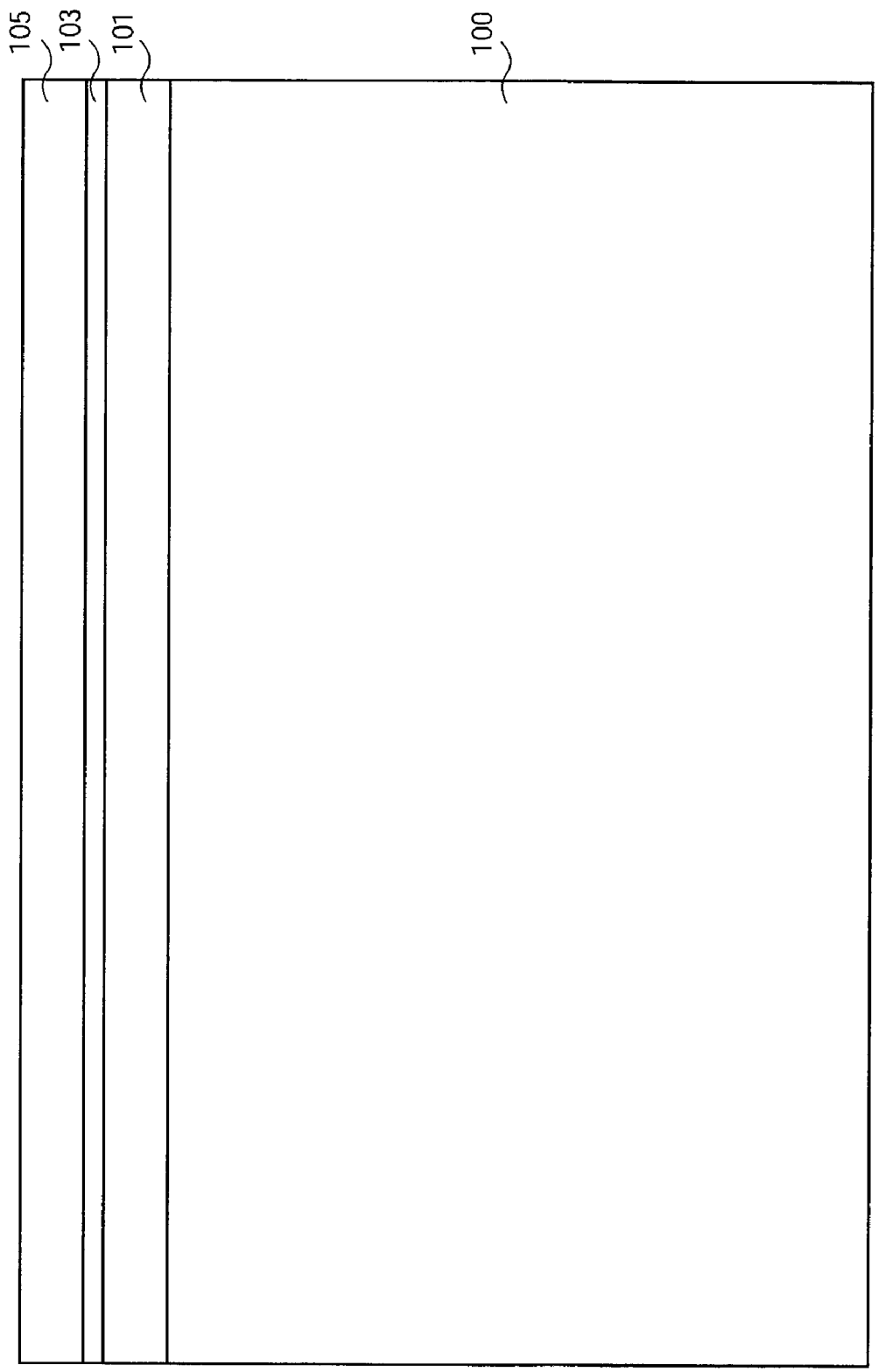
FIG. 1 shows an embodiment of the invention in the form of a low-k interlayer dielectric oxide that has been silanized.

Referring to FIG. 1, an embodiment of the invention is shown in the form of a low-k interlayer dielectric oxide that has been silanized. In one embodiment of the invention, the low-k interlayer dielectric oxide 101, such as but not limited to a carbon doped oxide films and organo-silicate glasses, may be formed over or on a substrate 100. In one embodiment of the invention, the substrate 100 may include a mono-crystalline silicon substrate having active devices such as but not limited to transistors and capacitors formed therein. Substrate 100 may also include dielectrics and metalization used to interconnect the active devices formed in the substrate together. In another embodiment of the invention, the substrate 100 may include a silicon on insulator (SOI) substrate, or other substrate used in semiconductor manufacturing. The surface of the low-k interlayer dielectric oxide 101 may be functionalized by silanization to improve adhesion between the surface of the low-k interlayer dielectric oxide 101 and an overlying layer 105 such as, but not limited to hard mask, etch stop, or barrier seed layer. In one embodiment of the invention, overlying layers 105 may be coupled to the low-k interlayer dielectric oxide 101 by being coupled to the silanized surface 103 of the low-k interlayer dielectric oxide 101. Other overlying layers 105 may also have improved adhesion with the surface of the low-k interlayer dielectric oxide 101 after the surface of the low-k interlayer dielectric oxide 101 has been functionalized by silanization and therefore these other layers may also be within the scope of the invention. Other low-k interlayer dielectric oxides 101, such as but not limited to porous and non-porous low-k interlayer dielectric oxides, may also be within the scope of the invention.

Prior to silanization, the surface of the low-k interlayer dielectric oxide 101 may have poor adhesion with overlying layers 105 because of weak bonds between a porous carbon doped oxidized surface of the low-k interlayer dielectric oxide 101 and the overlying layers 105. Other low-k interlayer dielectric oxide surface types may also have weak adhesion with the overlying layer 105. In one embodiment of the invention, the surface of the low-k interlayer dielectric oxide 101 may be silanized by exposing the surface of the low-k interlayer dielectric oxide 101 to silane-coupling agents. The surface modifying molecules may couple to the surface of the low-k interlayer dielectric oxide 101 by covalent bonds, such as but not limited to Si—O—Si bonds. These surface-modifying molecules may increase adhesion between the surface of the low-k interlayer dielectric oxide 101 and the overlying layers 105. In another embodiment of the invention, other types of non-overlying layers may have increased adherence to a surface of the low-k interlayer dielectric oxide 101 once the surface has been silanized.

In one embodiment of the invention, silanization of the low-k interlayer dielectric oxide 101 may transform the surface energy from approximately 25 mJ/m$^2$ (hydrophobic, non polar) to approximately 80 mJ/m$^2$ (hydrophilic, polar). In another embodiment of the invention, silanization of the low-k interlayer dielectric oxide 101 may transform the surface energy from hydrophilic to hydrophobic depending on the type of surface modifying molecules coupled to the surface of the low-k interlayer dielectric oxide 101 during silanization. The change in surface energy may allow for increased adhesion between the low-k interlayer dielectric oxide 101 and the overlying layer 105. The overlying layer 105 may be a layer such as but not limited to hard mask, etch stop, and barrier seed.

Figure 2:
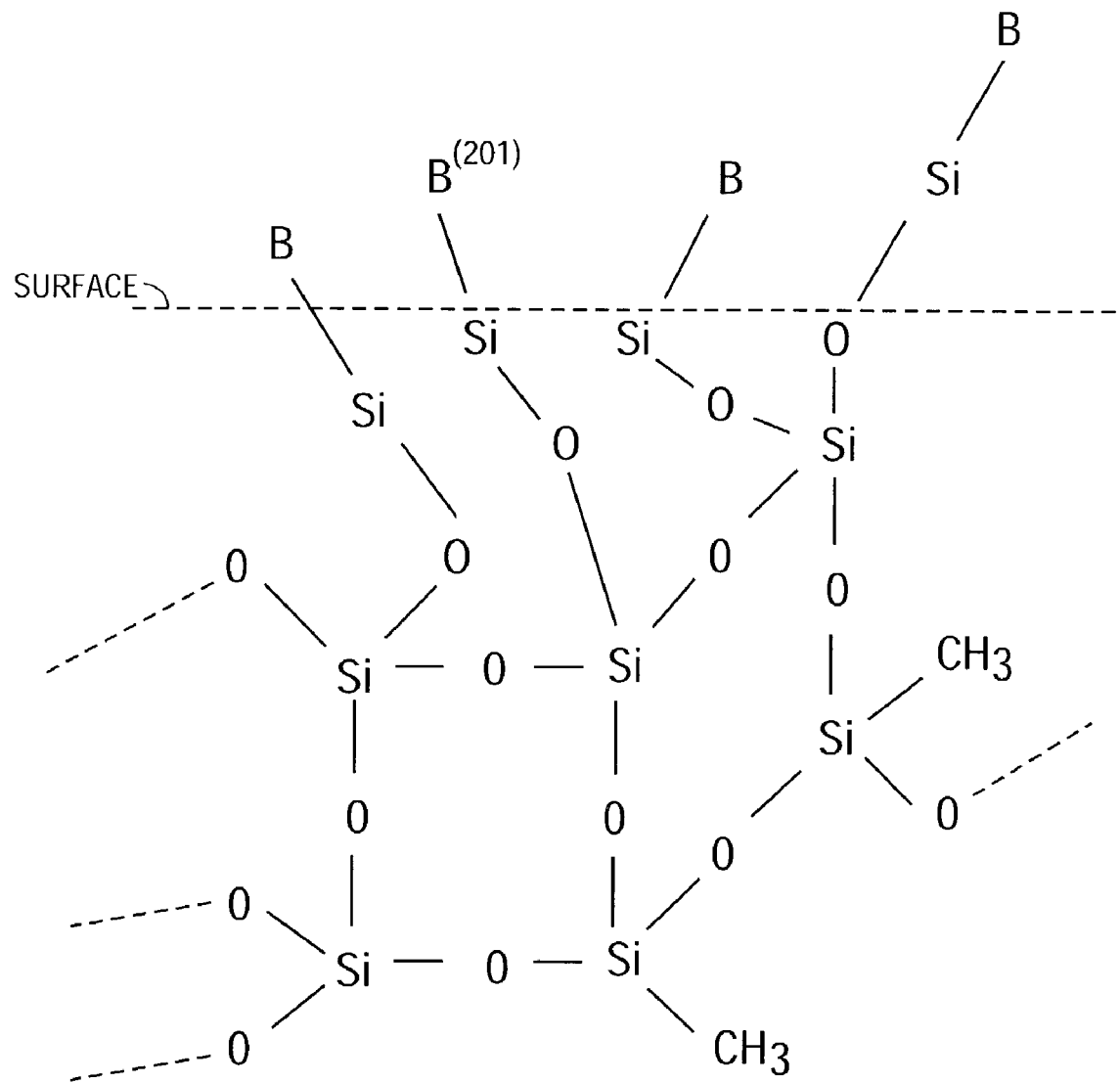
FIG. 2 shows an embodiment of the invention in the form of a chemical structure of a surface of a low-k interlayer dielectric oxide that has been silanized.

Referring to FIG. 2, an embodiment of the invention is shown in the form of a chemical structure of a silianized surface. The surface of a low-k interlayer dielectric oxide may be silanized by exposing the surface of the low-k interlayer dielectric oxide to silane-coupling agents. Silane-coupling agents may be a chemical compound in a class of organochloro or organoalkoxy silanes that spontaneously react with silica such as, but not limited to, the silica on the surface of the low-k interlayer dielectric oxide. Silane-coupling agents that may be used include but are not limited to disilazane, trichlorosilane, trimethoxy silane, triethoxy silane, silanol, siloxane, disiloxane, 3-amino propyltriethoxysilane, and n-dodecyltrichlorosilane. Silanizing the surface of the low-k interlayer dielectric oxide may couple surface modifying molecules 201 to the surface of the low-k interlayer dielectric oxide by Si—O—Si linkages to improve adhesion with an overlying layer, such as, but not limited to, hard mask, etch stop, and barrier seed layers. The surface modifying molecules 201 may be coupled by covalent Si—O—Si bonds strong enough to resist facile removal.

Figure 3:
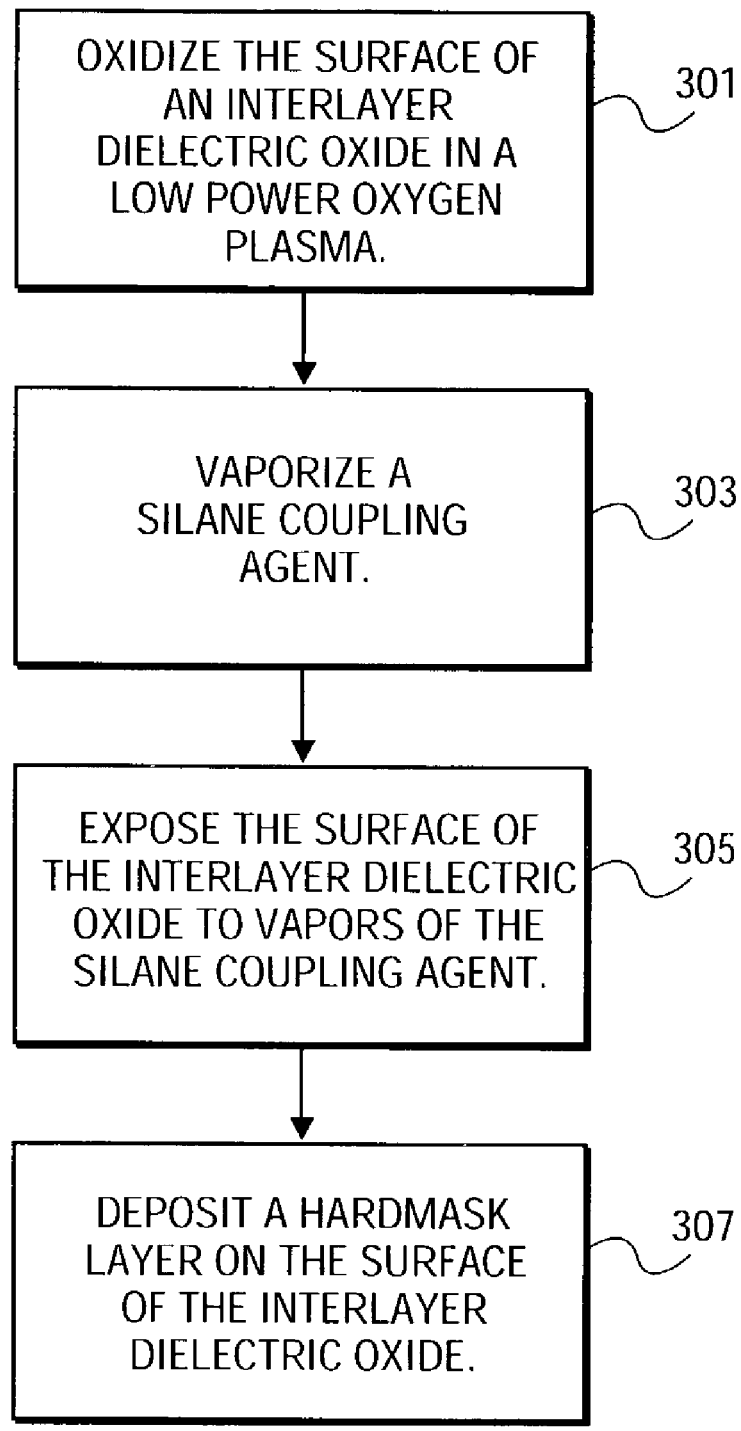
FIG. 3 shows an embodiment of the invention in the form of a flowchart for silanization of a low-k interlayer dielectric oxide by vapor.

Referring to FIG. 3, an embodiment of the invention is shown in the form of a flowchart for silanizing a low-k interlayer dielectric oxide with vapor. At block 301, the surface of a low-k interlayer dielectric oxide may be oxidized in a low power oxygen plasma. For example, a low power oxygen plasma sufficient to ash photoresist may be used. The low power oxygen plasma may be needed to increase Si—O— bond content on the surface of the low-k interlayer dielectric oxide if the surface of the low-k interlayer dielectric oxide surface is not carbon depleted. For example, the low-k interlayer dielectric oxide surface may have been carbon depleted in a plasma etching step used for patterning. The silane-coupling agents may bond better to the silica formed on the oxidized, carbon depleted surface of the low-k interlayer dielectric oxide due to the formation of Si—O—Si covalent bonds. However, in one embodiment of the invention, the surface of the low-k interlayer dielectric oxide may be silanized without depleting the carbon on the surface of the low-k interlayer dielectric oxide. At block 303, a silane-coupling agent may be vaporized. For example, low molecular weight silane-coupling agents such as, but not limited to, hexamethyl disilazane may be volatile at room temperature and room pressure (i.e. approximately standard atmospheric conditions) and may vaporize without additional heat. In other embodiments of the invention, solutions of silane-coupling agents may be evaporated by heating. For example, a solution of silane-coupling agent may be heated in a separate container to produce silane-coupling agent vapors. At block 305, a low-k interlayer dielectric oxide surface may be exposed to the vapors of said silane-coupling agent. In one embodiment of the invention, the vapors of the silane-coupling agent may be allowed to flow freely over the surface of the low-k interlayer dielectric oxide. In another embodiment of the invention, the vapors of the silane-coupling agent may be pulled over the low-k interlayer dielectric oxide by a low pressure. At block 307, a hard mask, etch stop, or barrier seed layer may be coupled to the surface of the low-k interlayer dielectric oxide. Other deposited layers may also be within the scope of the invention.

Figure 4:
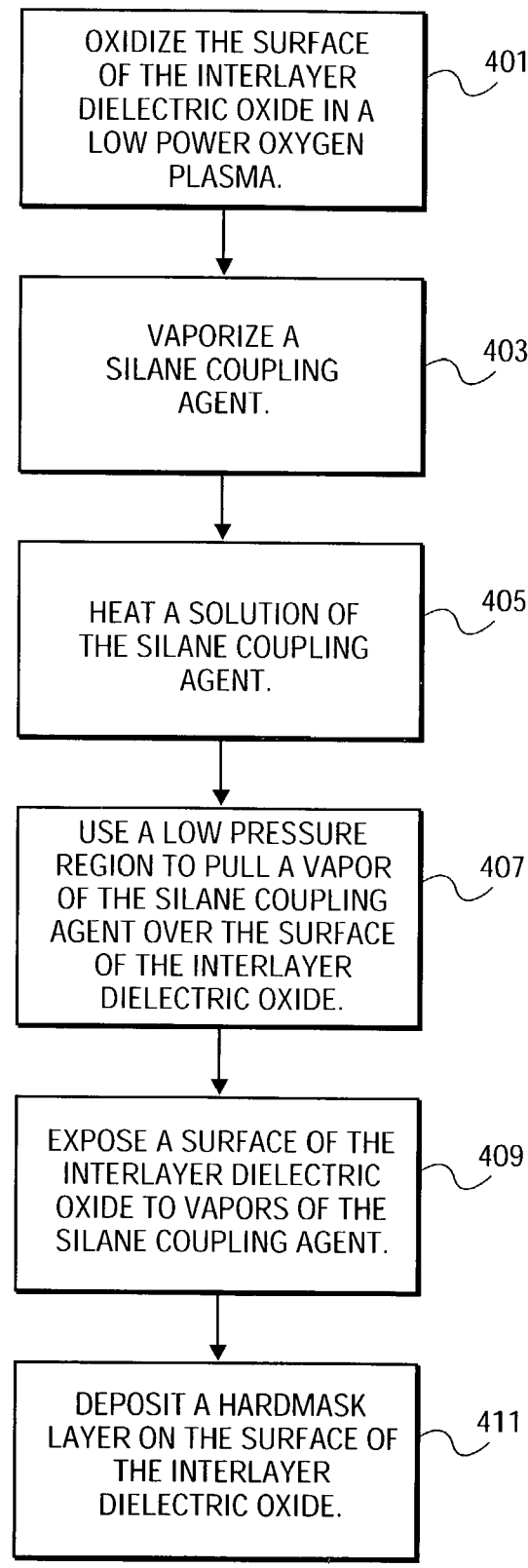
FIG. 4 shows an embodiment of the invention in the form of a flowchart for silanization of a low-k interlayer dielectric oxide by a vapor from a solution that has been heated and/or subjected to a vacuum.

Referring to FIG. 4, an embodiment of the invention is shown in the form of a flowchart for silanizing a low-k interlayer dielectric oxide layer by exposing it to vapors that have been heated or exposed to low pressure. At block 401, the surface of the low-k interlayer dielectric oxide may be oxidized in a low power oxygen plasma. At block 403, a silane-coupling agent may be vaporized. At block 405, a silane-coupling agent may be vaporized by heating a solution of the silane-coupling agent. At block 407, a low pressure region may be used to pull a vapor of the silane-coupling agent over the surface of the interlayer dielectric oxide. In one embodiment of the invention, a near vacuum may be used to vaporize a liquid solution of the silane-coupling agent. At block 409, the surface of a low-k interlayer dielectric oxide may be exposed to vapors of the silane-coupling agent. At block 411, a hard mask, etch stop, or barrier seed layer may be coupled to the surface of a low-k interlayer dielectric oxide.

Figure 5:
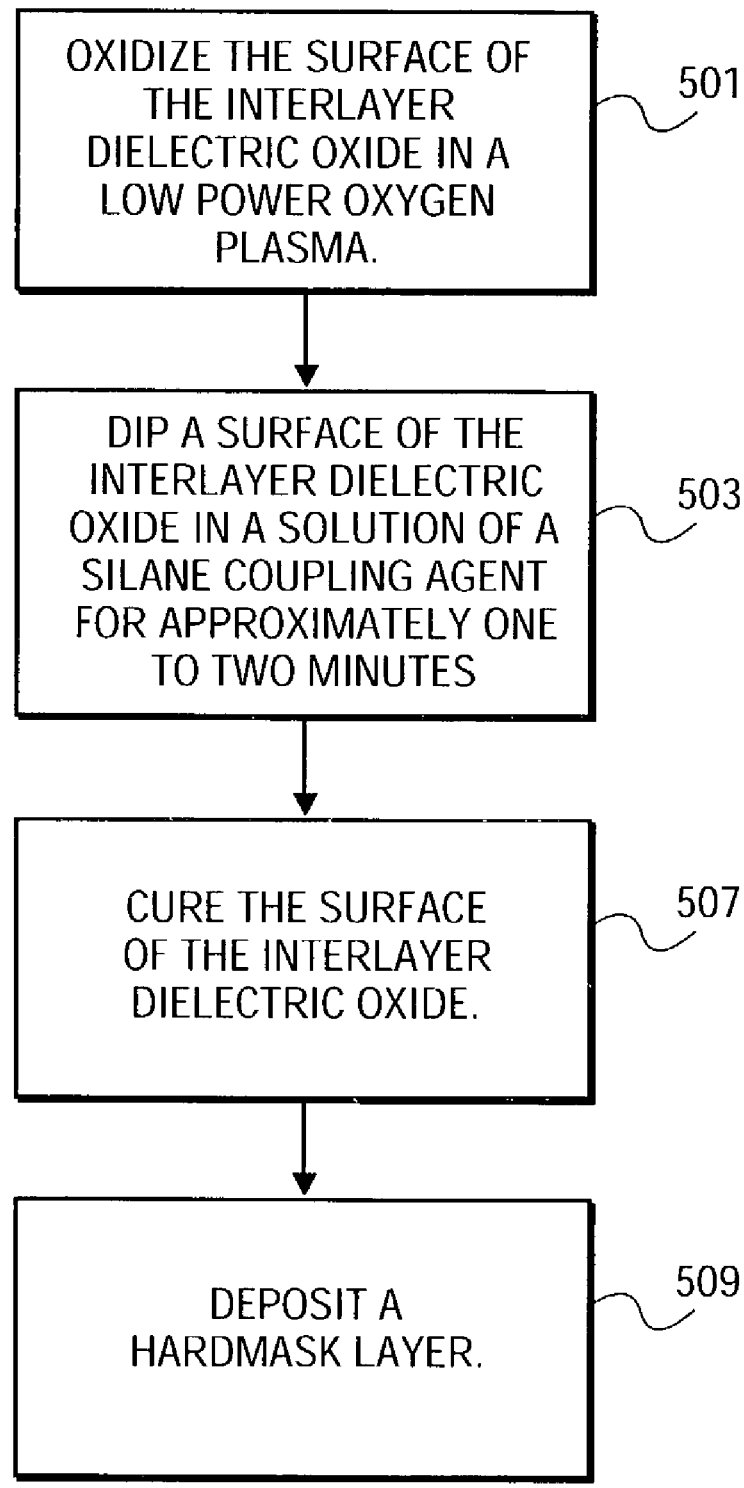
FIG. 5 shows an embodiment of the invention in the form of a flowchart for silanization of a low-k interlayer dielectric oxide by dipping into a silane solution.

Referring to FIG. 5, an embodiment of the invention is shown in the form of a flowchart for silanizing a low-k interlayer dielectric oxide by dipping in a solution of silane-coupling agents. At block 501, a surface of a low-k interlayer dielectric oxide may be oxidized in a low power oxygen plasma. At block 503, the low-k interlayer dielectric oxide may be dipped in a solution of silane-coupling agent. A solution of silane-coupling agent may be made by adding silane-coupling agent to a solvent such as but not limited to ethyl alcohol, water, or hexane. In one embodiment, the pH of the solution may be adjusted to approximately five with an acid such as but not limited to acetic acid. In one embodiment, with a solution strength of silane-coupling agent approximately in a range of 0.02 percent to 2 percent, the interlayer dielectric oxide may be left in the silane-coupling agent for a time approximately in the range of one minute to 60 minutes. In other embodiments of the invention, the interlayer dielectric oxide may be left in the silane-coupling agent for more than 60 minutes. In other embodiments, other solution strengths and dipping times may also be used. At block 507, the low-k interlayer dielectric oxide may be cured at 110 degrees Celsius for approximately 20 to 30 minutes. Other cure temperatures and cure times may also be within the scope of an embodiment of the invention. In one embodiment of the invention, the low-k interlayer dielectric oxide may not need to be cured after dipping into a solution of a silane-coupling agent. At block 509, a hard mask, etch stop, or barrier seed layer may be coupled to the surface of a low-k interlayer dielectric oxide. Other layers may also be within the scope of the invention.

Figure 6:
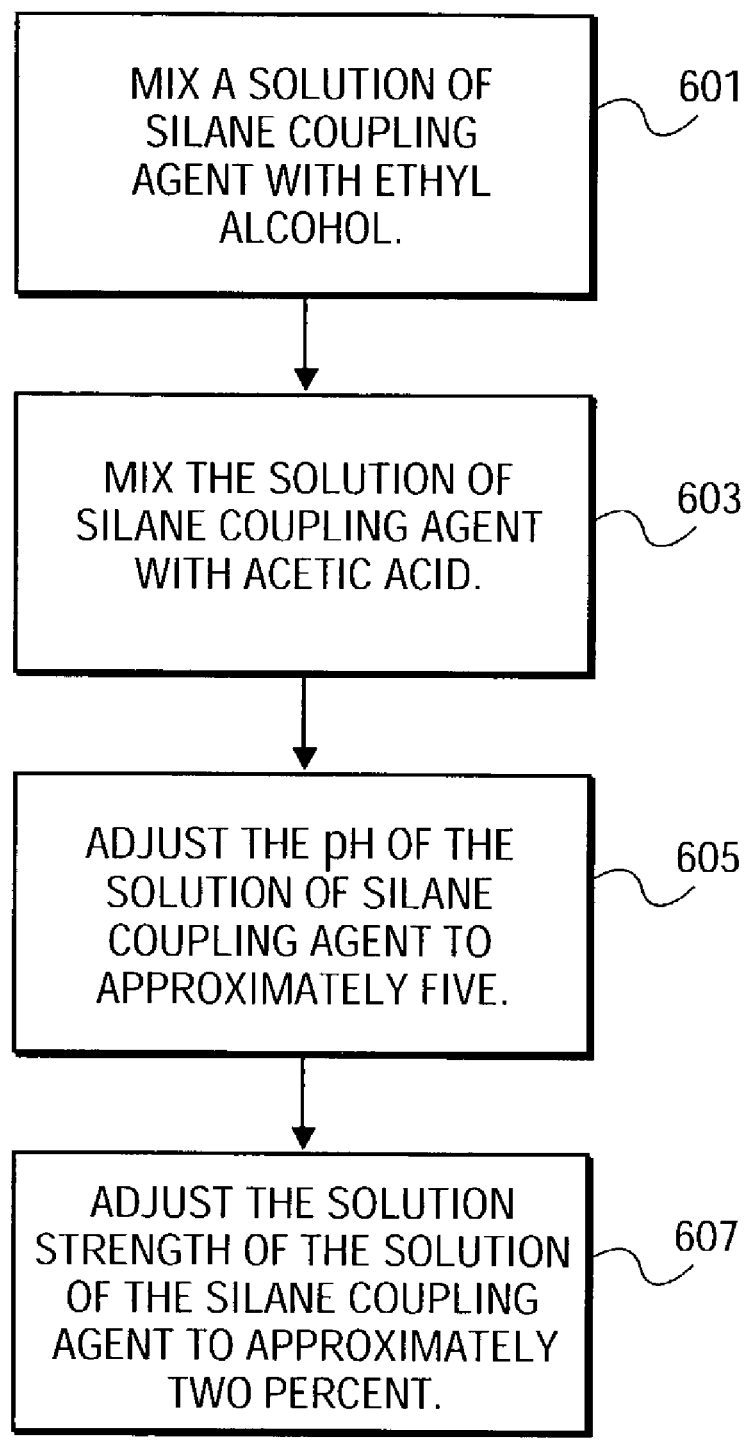
FIG. 6 shows an embodiment of the invention in the form of a flowchart for the preparation of a silane solution.

Referring to FIG. 6, an embodiment of the invention is shown in the form of a flowchart for preparing a solution for dipping a low-k interlayer dielectric oxide into in order to silanize it. At block 601, a solution of silane-coupling agent may be mixed with a solvent such as but not limited to ethyl alcohol, water, and hexane. At block 603, the solution of silane-coupling agent may be mixed with an acid such as but not limited to acetic acid. At block 605, the pH of the silane-coupling agent solution may be adjusted to approximately five. At block 607, the solution strength of the silane-coupling agent solution may be adjusted to a strength approximately in the range of 0.2 percent to 2 percent. Other pH values and solution strengths may also be within the scope of the invention.

Figure 7:
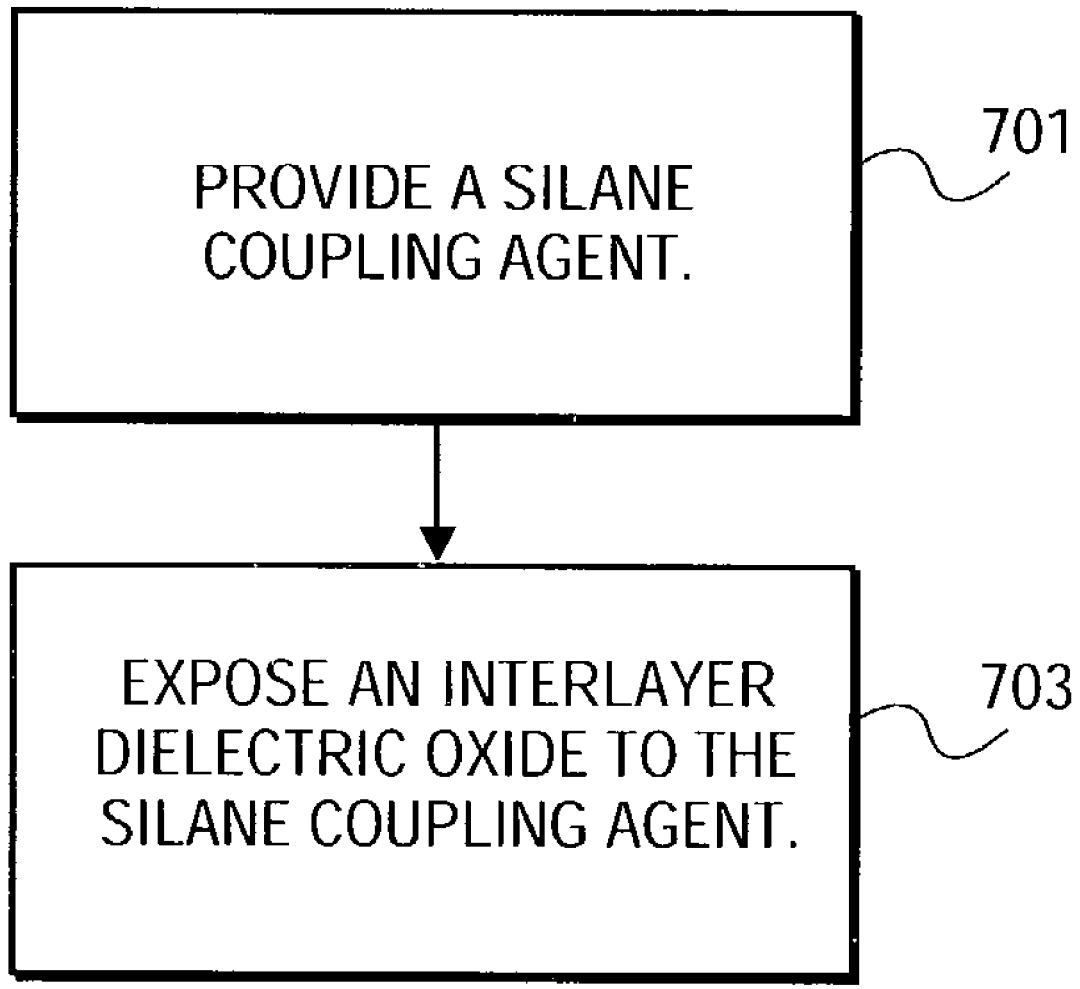
FIG. 7 shows an embodiment of the invention in the form of a flowchart of instructions provided by a machine-readable medium.

Referring to FIG. 7, an embodiment of the invention is shown in the form of a flowchart of instructions provided by a machine-readable medium. A machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc. At block 701, a silane-coupling agent may be provided. The silane-coupling agent may be in the form of a vapor. In another embodiment of the invention, the silane-coupling agent may be prepared in the form of a solution. At block 703, an interlayer dielectric oxide may be exposed to the silane-coupling agent. The interlayer dielectric oxide may be dipped into a solution of silane-coupling agent. In another embodiment of the invention, the silane-coupling agent may be vaporized and pulled over the interlayer dielectric oxide.

Figure 8A:
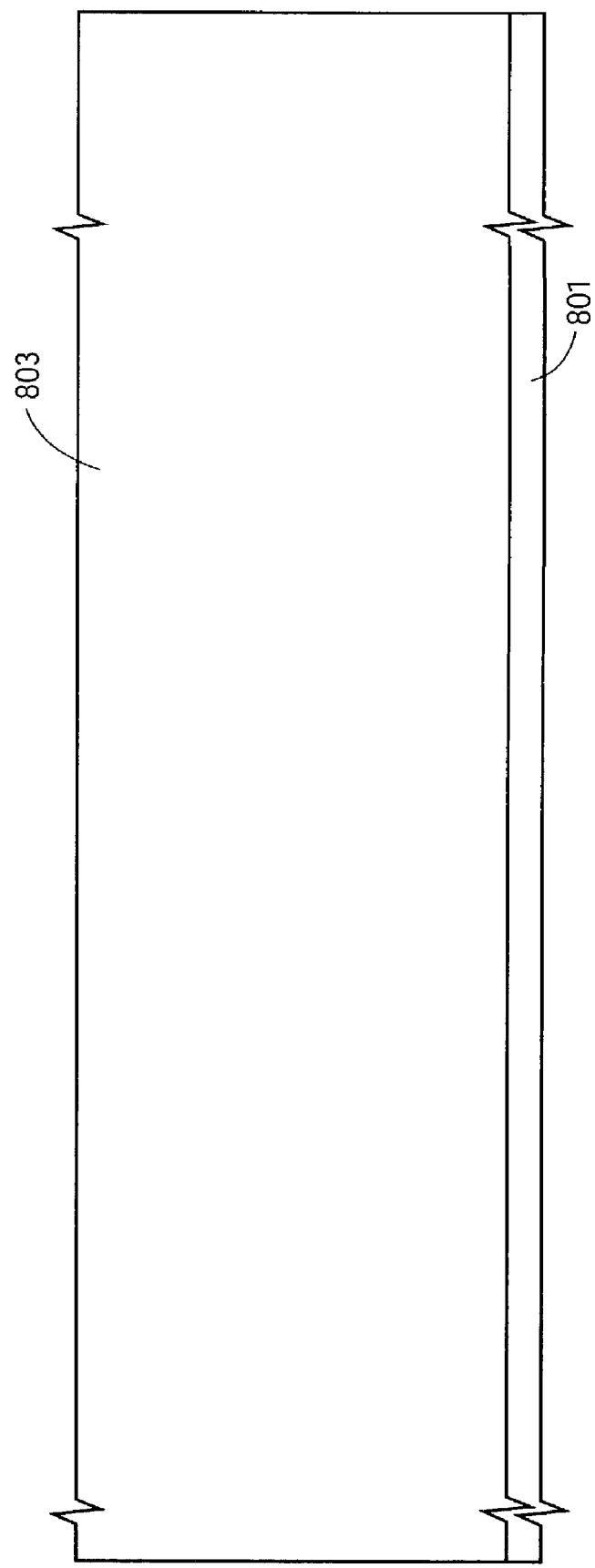
FIG. 8A shows a low-k interlayer dielectric oxide.

Referring to FIG. 8A, 8B, 8C, and 8D an embodiment of the invention is shown in the form of silanizing a low-k interlayer dielectric oxide surface before barrier seed layer deposition. Referring to FIG. 8A, a low-k interlayer dielectric oxide 803, may be coupled to substrate 801 such as, but not limited to a mono-crystalline substrate. The surface of the low-k interlayer dielectric oxide 803 may be silanized by being exposed to silane-coupling agents. These silane-coupling agents may couple better if the surface of the low-k interlayer dielectric oxide 803 is porous and carbon depleted prior to exposing the surface of the low-k interlayer dielectric oxide 803 to the silane-coupling agents. If the surface of the low-k interlayer dielectric oxide 803 is not carbon depleted, the surface of the low-k interlayer dielectric oxide 803 may be carbon depleted by briefly oxidizing the surface of the low-k interlayer dielectric oxide 803 in low power oxygen plasma before silanization. In one embodiment of the invention, the low-k interlayer dielectric oxide 803 may be put into a vacuum plasma chamber. A low power plasma may be struck in the chamber at approximately 200–500 watts on a flowing oxygen gas. The low-k interlayer dielectric oxide 803 may remain in the chamber for approximately three to sixty seconds. Other embodiments of the invention may use more or less power for more or less time to deplete the carbon from the surface of the low-k interlayer dielectric oxide 803.

Figure 8B:
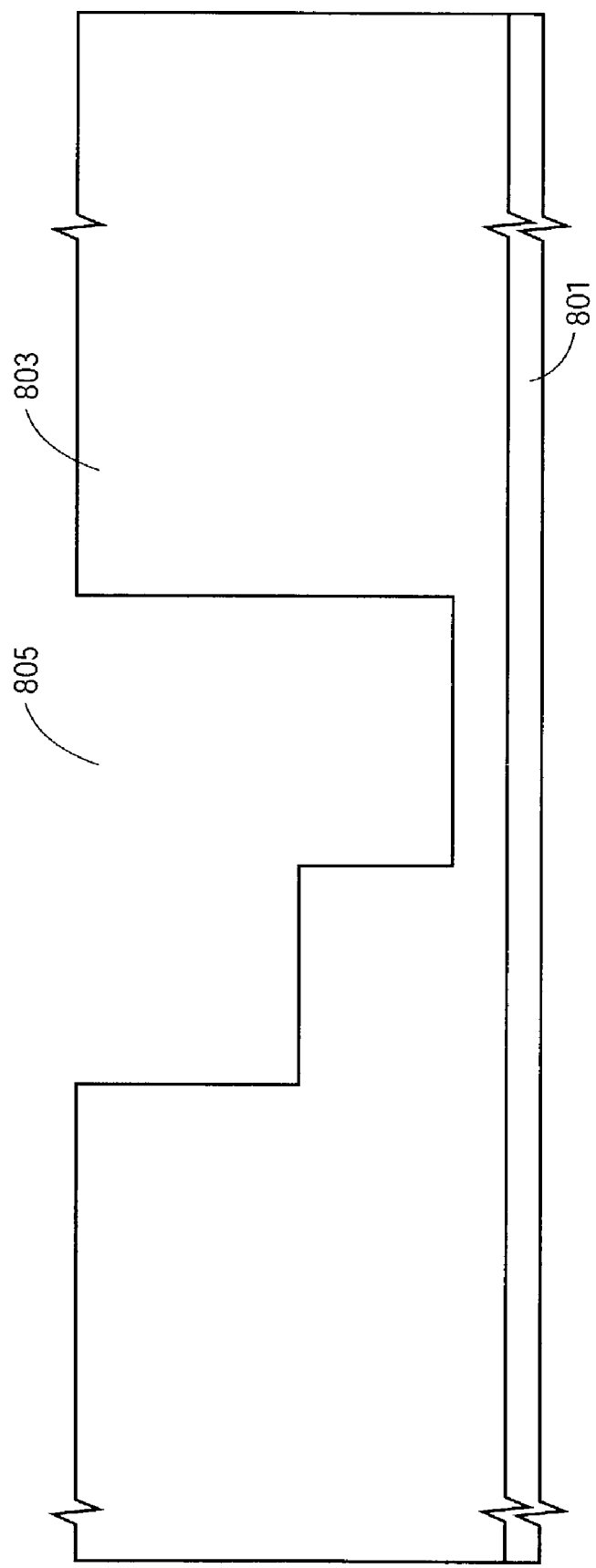
FIG. 8B shows a low-k interlayer dielectric oxide that has been etched.

Referring to FIG. 8B, an embodiment of a low-k interlayer dielectric oxide 803 after being etched is shown. Prior to silanization, the low-k interlayer dielectric oxide 803 may be etched. The surface of the low-k interlayer dielectric oxide 803 may be silanized in the etched portion 805. In another embodiment of the invention, the surface of the low-k interlayer dielectric oxide 803 may be silanized before it is etched.

Figure 8C:
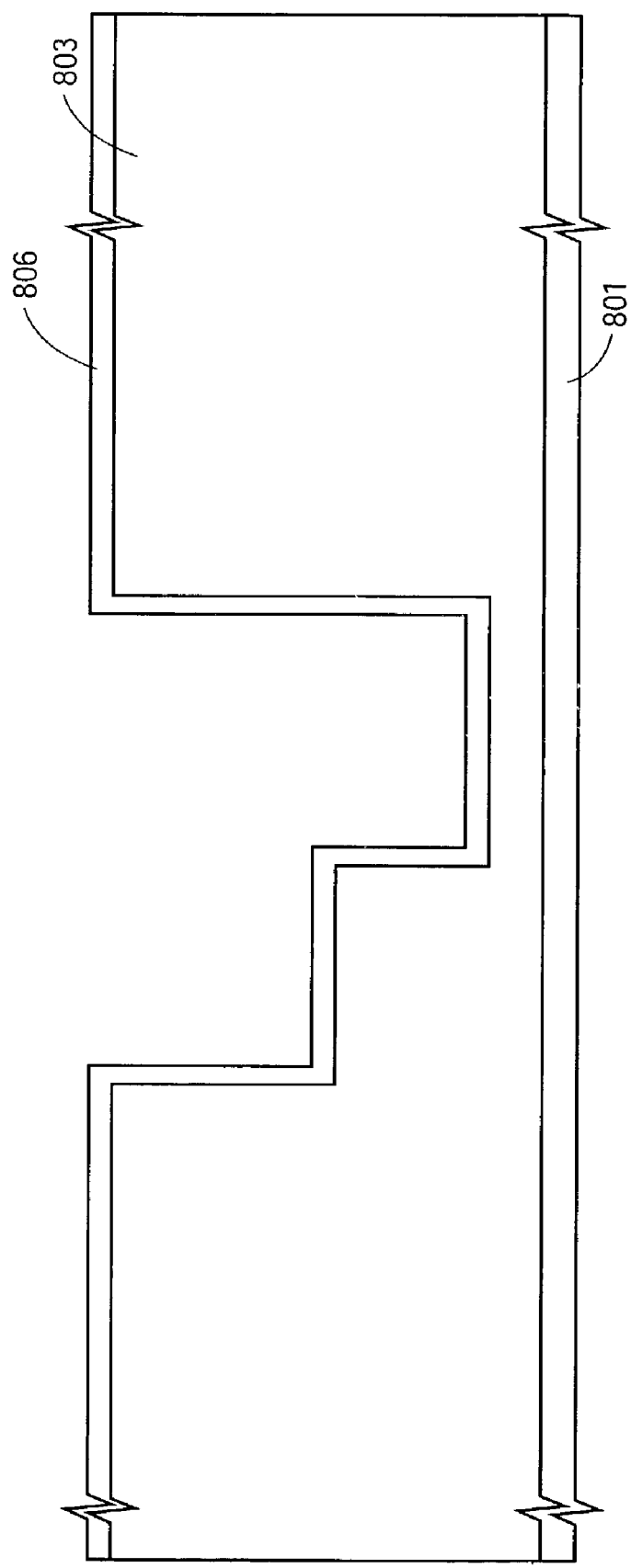
FIG. 8C shows an embodiment of the invention in the form of a low-k dielectric oxide that has been silanized prior to barrier seed layer deposition.
Figure 8D:
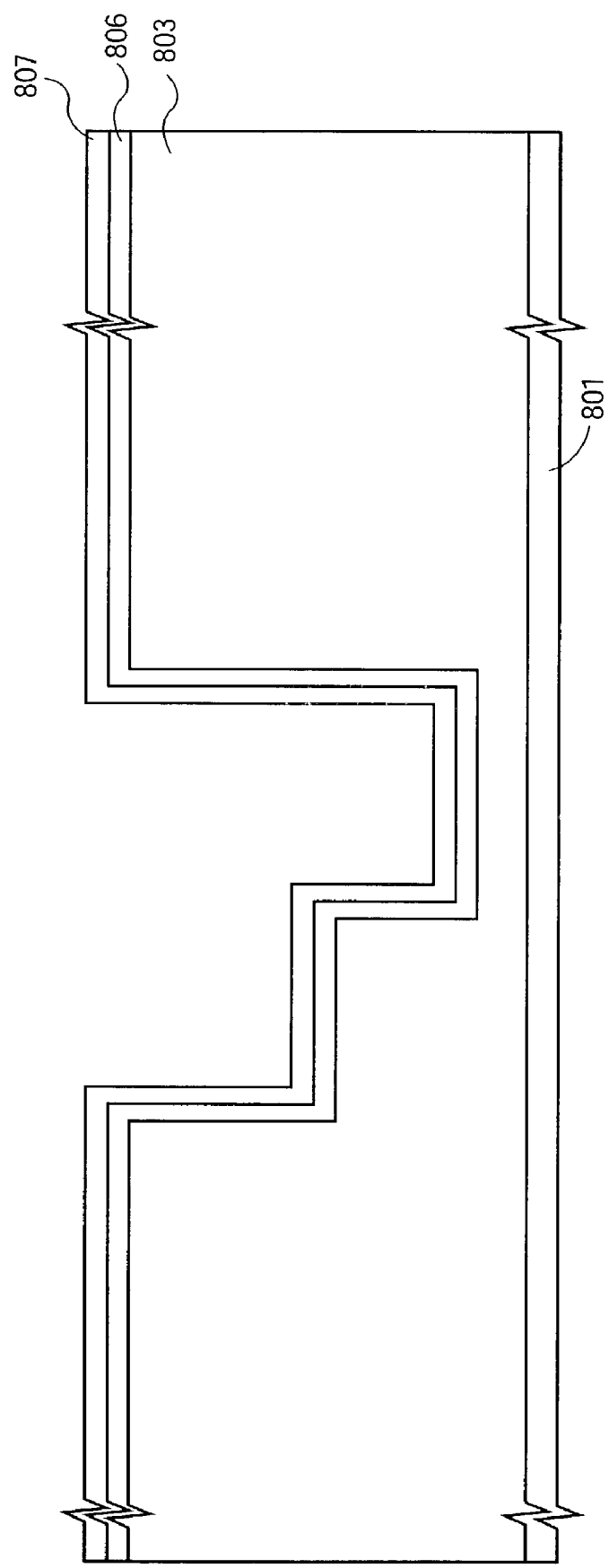
FIG. 8D shows an embodiment of the invention in the form of a low-k dielectric oxide with a silanized surface and a deposited barrier seed layer.

Referring to FIG. 8C, a low-k interlayer dielectric oxide 803 may be silanized after being etched, but prior to depositing a new layer in the etched portion, for example by dual damascene integration. The silanized surface 806 may have increased adhesion to deposited layers. For example, as seen in FIG. 8D, a tantulum nitride barrier layer 807 may be deposited on the silanized surface 806 of the low-k interlayer dielectric oxide 803. In another embodiment, a silicon nitride etch stop may be deposited on the silanized surface 806 of the low-k interlayer dielectric oxide 803. Other types of deposited layers may also be within the scope of the invention.

Figure 9A:
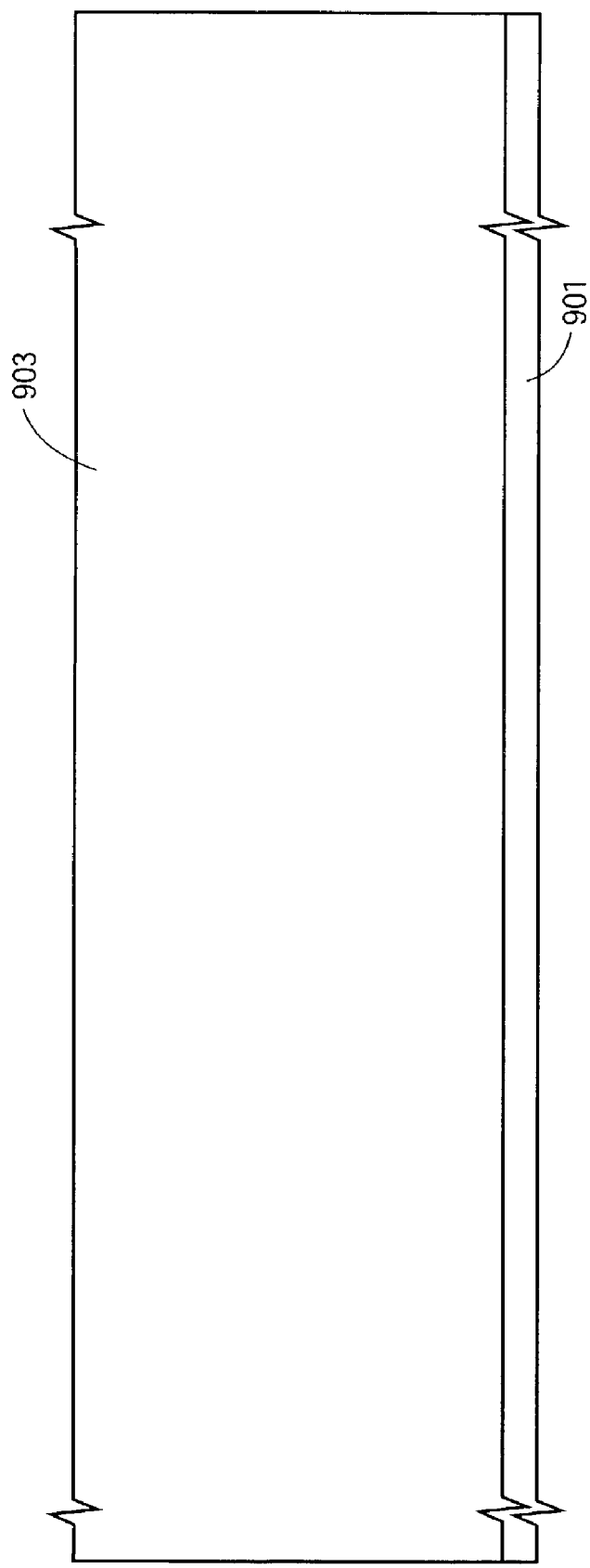
FIG. 9A shows a low-k interlayer dielectric oxide.
Figure 9B:
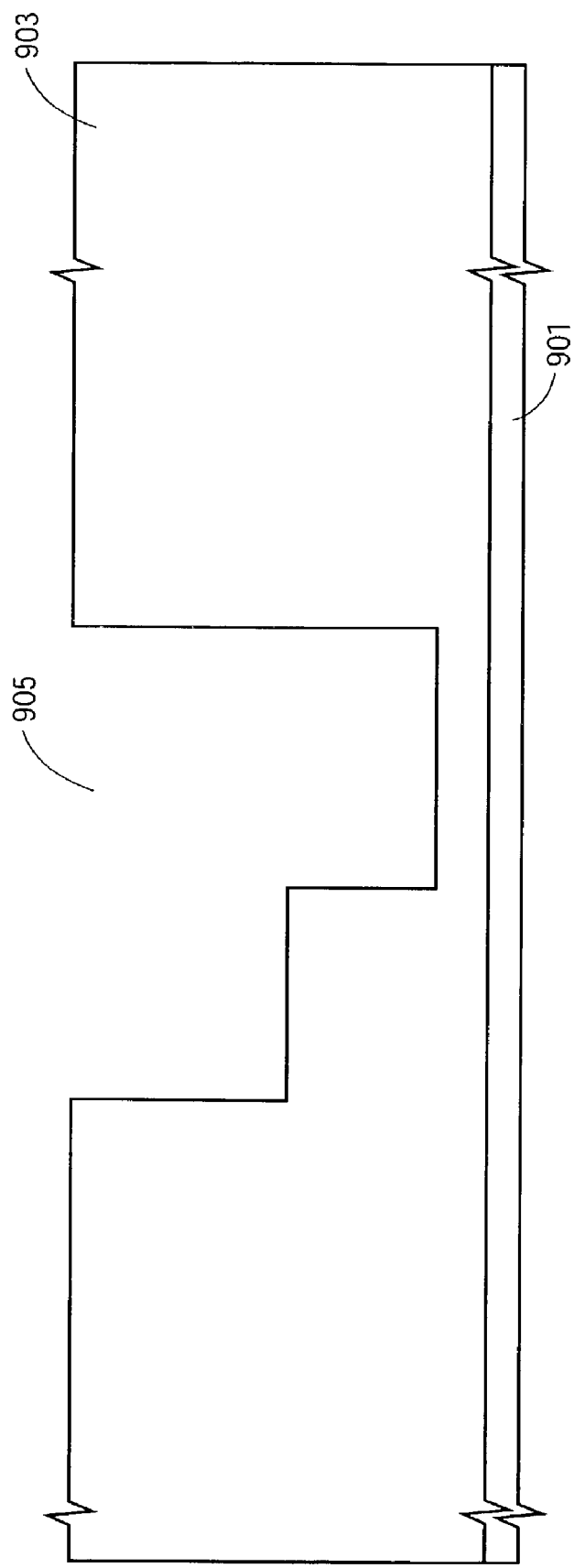
FIG. 9B shows a low-k interlayer dielectric oxide that has been etched.
Figure 9C:
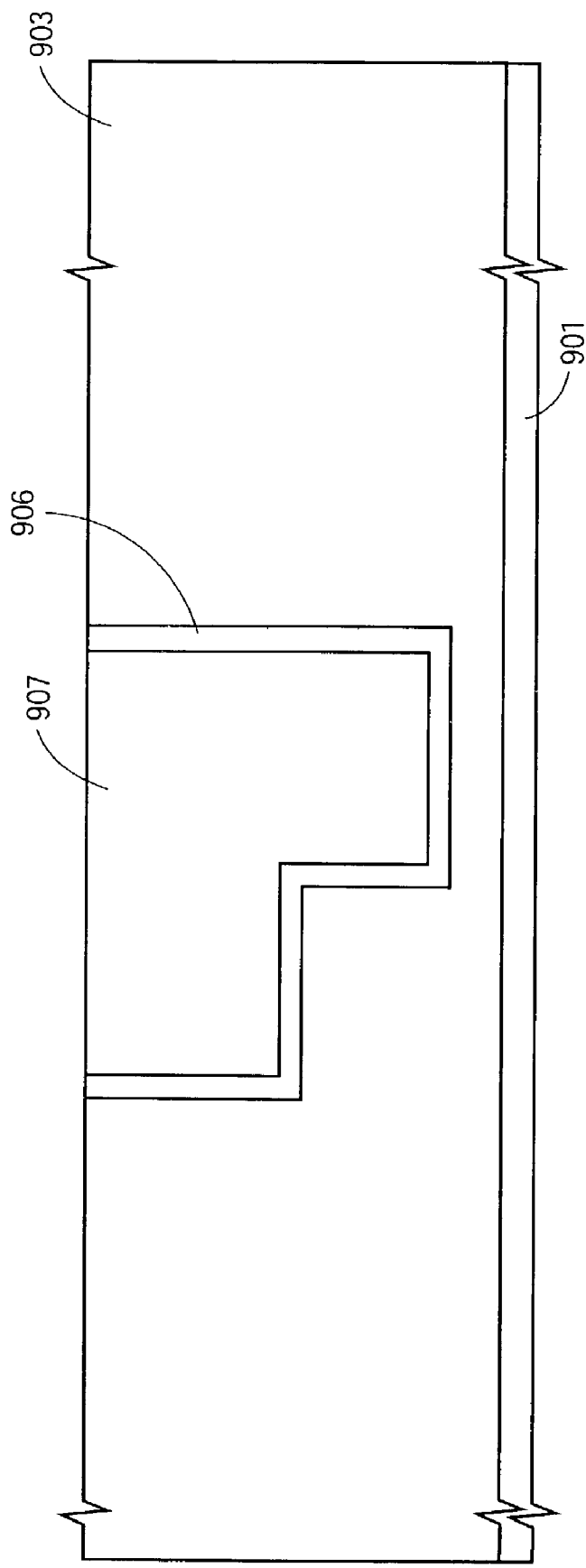
FIG. 9C shows a low-k interlayer dielectric oxide that has been etched and had a copper interconnect deposited.
Figure 9D:
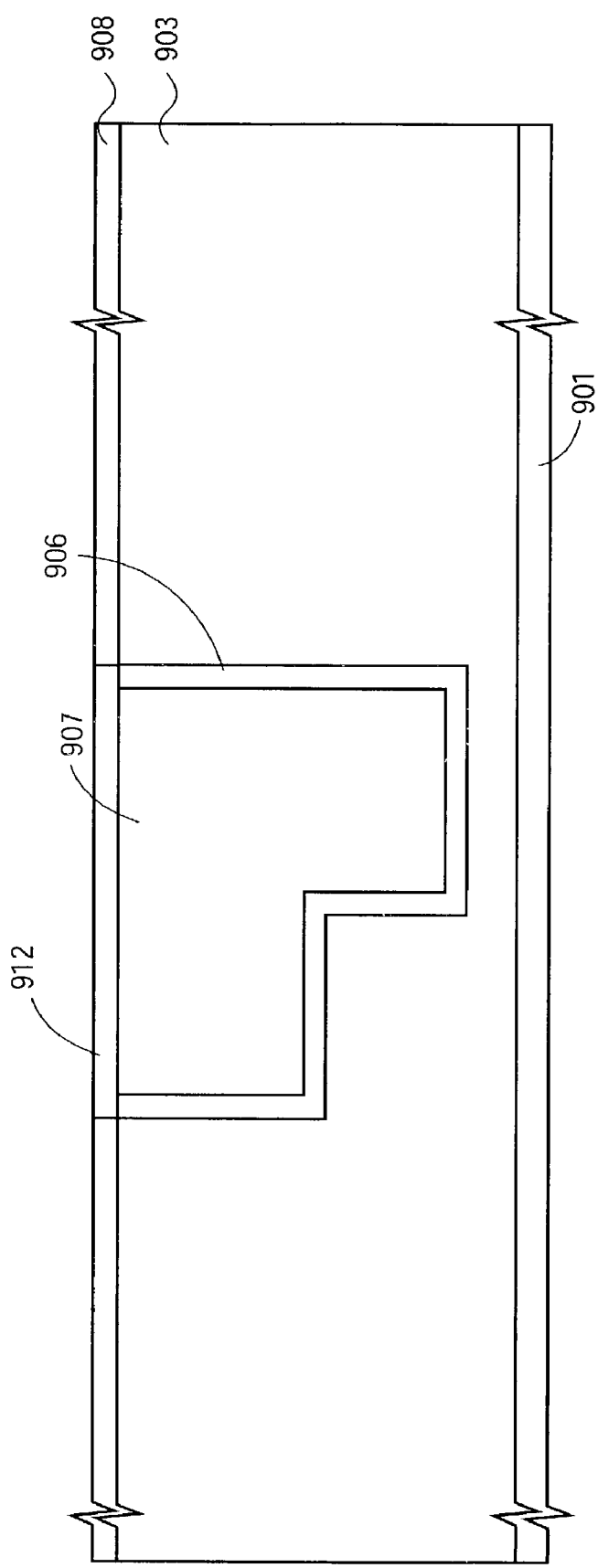
FIG. 9D shows an embodiment of the invention in the form of a low-k interlayer dielectric oxide that has been silanized after depositing a copper interconnect.

Referring to FIG. 9A, 9B, 9C, 9D, and 9E an embodiment of the invention is shown in the form of a low-k interlayer dielectric oxide prepared by silanization with an etch stop layer deposited on the silanized surface layer. Referring to FIG. 9A, a low-k interlayer dielectric oxide 903, may be coupled to a substrate 901, such as, but not limited to a mono-crystalline silicon substrate. Referring to FIG. 9B, a low-k interlayer dielectric oxide 903 may be etched. The shape of the etched portion 905 may be adapted to the type of layer to be deposited in the etched portion 905. For example, referring to FIG. 9C, the low-k interlayer dielectric oxide 903 coupled to underlying substrate 901 may have a copper interconnect 907 coupled in the etched portion 905. For example, in one embodiment of the invention, the low-k interlayer dielectric oxide 903 may have multiple layers of metal lines connected to other metal lines by vias. The copper interconnect 907 may serve as a metal line or may serve as a via to connect various levels of metal lines. Other uses for the copper interconnect 907 may also be within the scope of the invention. In one embodiment of the invention, before the copper interconnect 907 is coupled to the etched portion 905, a barrier seed layer 906 may be coupled inside the etched portion 905. As shown in FIGS. 8A–8D, the etched portion 905 may be silanized prior to depositing a barrier seed layer 906. Referring to FIG. 9D, the surface of the low-k interlayer dielectric oxide 903 may be prepared by silanization. The silanized surface 908 may have increased adhesion to deposited layers. In one embodiment of the invention, the silane may be weakly physisorbed on the copper interconnect 907 as silanized copper interconnect surface 912. The silanized copper interconnect surface 912 may be removed by a process including but not limited to washing off and annealing. In another embodiment of the invention, the silanized copper interconnect surface 912 may not be removed. The silanized copper interconnect surface 912 may increase electromigration resistance and reliability of the copper interconnect 907.

Figure 9E:
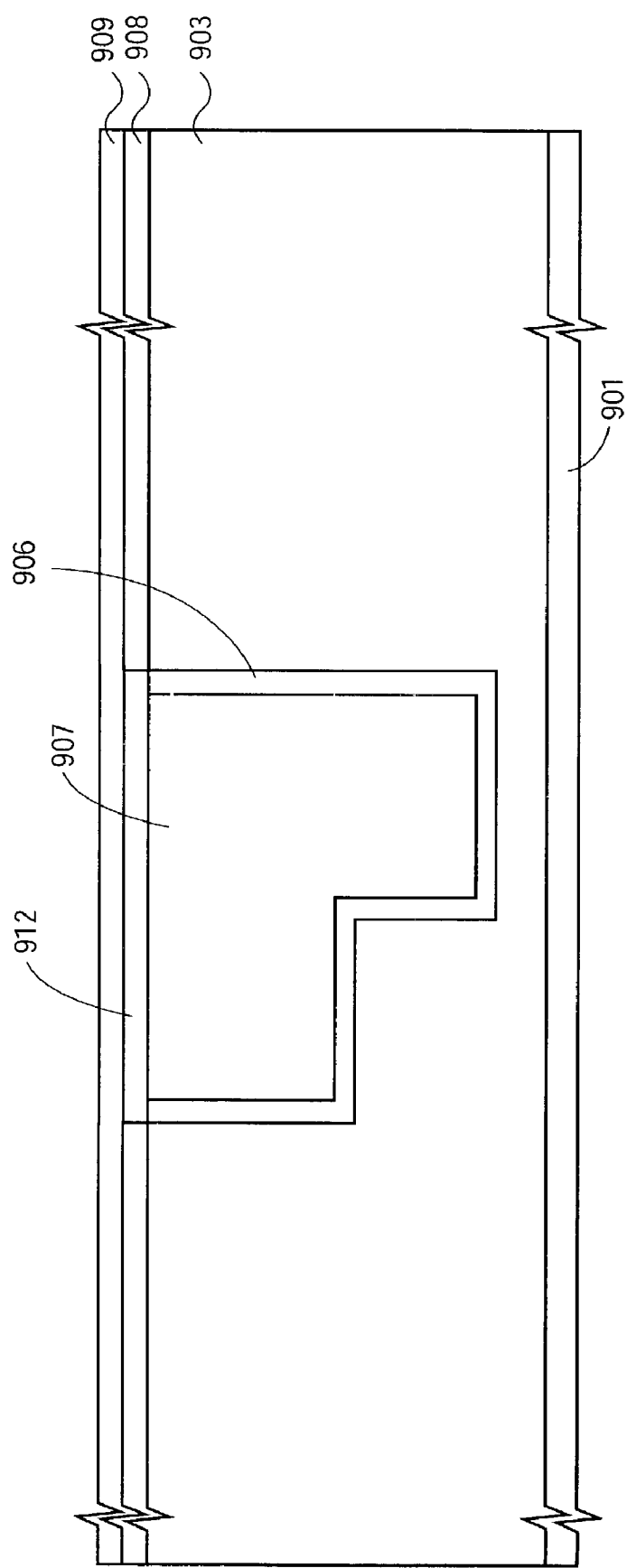
FIG. 9E shows an embodiment of the invention in the form of a low-k interlayer dielectric oxide with a silanized surface and a deposited etch stop layer.

Referring to FIG. 9E, after silanizing the surface of the low-k interlayer dielectric oxide 903, an etch stop layer 909 may be deposited on the silanized surface 908, with or without the silanized copper interconnect surface 912 present. Other layers, such as but not limited to hard mask and barrier seed, may also be coupled to the silanized surface 908 on the low-k interlayer dielectric oxide 903.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

We claim:

1. A method comprising:
   vaporizing a silane-coupling agent;
   exposing a low k interlayer dielectric oxide comprising carbon doped oxide to vapors of said silane-coupling agent to improve an adhesion quality of the low k interlayer dielectric oxide; and
   coupling a layer selected from the group consisting of a hard mask, an etch stop, and a barrier seed layer to said low k interlayer dielectric oxide after said exposing said low k interlayer dielectric oxide to vapors of said silane-coupling agent.

2. The method of claim 1 wherein vaporizing said silane-coupling agent includes exposing said silane-coupling agent to approximately room temperature and approximately room pressure.

3. The method of claim 1 wherein vaporizing said silane-coupling agent includes heating a solution of said silane-coupling agent.

4. The method of claim 3 further comprising using a low pressure to pull said vapor of said silane-coupling agent over said low k interlayer dielectric oxide.

5. The method of claim 3 wherein said silane-coupling agent includes hexamethyl disilazane.

6. The method of claim 1 further comprising oxidizing said interlayer dielectric oxide in a low power oxygen plasma prior to said exposing.

7. A method comprising:
   dipping an interlayer dielectric oxide comprising carbon doped oxide in a solution of silane-coupling agent to improve an adhesion quality of the low k interlayer dielectric oxide; and
   coupling a layer, selected from a group consisting of a hard mask, an etch stop, and a barrier seed layer, to said low k inter layer dielectric oxide.

8. The method of claim 7 further comprising mixing said solution of silane-coupling agent with a chemical selected from a group consisting of ethyl alcohol, water, hexane, and acetic acid.

9. The method of claim 7 further comprising adjusting a pH of said solution of said silane-coupling agent to approximately five.

10. The method of claim 7 further comprising adjusting a solution strength of said solution of said silane-coupling agent to a solution strength approximately in a range of 0.02 to 2 percent.

11. The method of claim 7 wherein said dipping further includes leaving said low k interlayer dielectric oxide in said solution for a time approximately in a range of one to 60 minutes.

12. The method of claim 7 further comprising curing said low k interlayer dielectric oxide after said dipping.

13. The method of claim 12 wherein said curing said low k interlayer dielectric oxide includes exposing said low k interlayer dielectric oxide to a temperature of approximately 110 degrees Celsius for approximately 20 to 30 minutes.

14. The method of claim 7 further comprising oxidizing said low k interlayer dielectric oxide in a low power oxygen plasma prior to said dipping.

15. An apparatus comprising:
   an low k interlayer dielectric oxide comprising carbon doped oxide;
   a silane-coupling agent deposited on a surface of said low k interlayer dielectric oxide to improve an adhesion quality of the low k interlayer dielectric oxide; and
   an etch stop layer or a barrier seed layer coupled to said surface of said low k interlayer dielectric oxide.

16. The apparatus of claim 15 wherein said silane-coupling agent is selected from a group consisting of disilazane, trichlorosilane, trimethoxy silane, triethoxy silane, silanol, siloxane, disiloxane, 3-amino propyltriethoxysilane, and n-dodecyltrichlorosilane.

17. A system comprising:
   an porous interlayer dielectric oxide;
   a copper interconnect coupled to said porous interlayer dielectric oxide;
   a silane-coupling agent deposited on a surface of said porous interlayer dielectric oxide; and
   a hard mask coupled to said porous interlayer dielectric oxide.

18. The system of claim 17 wherein said porous interlayer dielectric oxide comprising carbon doped oxide.

19. The system of claim 17 wherein said silane-coupling agent is selected from a group consisting of disilazane, trichlorosilane, trimethoxy silane, triethoxy silane, silanol, siloxane, disiloxane, 3-amino propyltriethoxysilane, and n-dodecyltrichlorosilane.

20. A method, comprising:
   providing instructions by a machine readable medium executable by a processor; and
   causing said processor, with said machine readable medium, to perform operations comprising:
      providing a silane-coupling agent; and
      exposing a low k interlayer dielectric oxide comprising carbon doped oxide to said silane-coupling agent.

21. The method of claim 20 wherein said providing a silane-coupling agent includes vaporizing said silane-coupling agent.

22. The method of claim 20 wherein said providing a silane-coupling agent includes preparing a solution of said silane-coupling agent.

23. The method of claim 20 wherein said exposing a low k interlayer dielectric oxide to said silane-coupling agent includes dipping said interlayer dielectric oxide in said silane-coupling agent.

* * * * *

UNITED STATES PATENT AND TRADEMARK OFFICE
CERTIFICATE OF CORRECTION

| | | |
|---|---|---|
| PATENT NO. | : 6,974,762 B2 | |
| APPLICATION NO. | : 10/209700 | |
| DATED | : December 13, 2005 | |
| INVENTOR(S) | : Gracias et al. | |

It is certified that error appears in the above-identified patent and that said Letters Patent is hereby corrected as shown below:

In column 7, line 26, insert --low k-- between "said" and "interlayer".

In column 7, line 29, delete "an", change to --a--.

In column 7, line 29, insert --low k-- between "a" and "interlayer".

Signed and Sealed this

Twenty-eighth Day of November, 2006

JON W. DUDAS
*Director of the United States Patent and Trademark Office*